United States Patent
Safari et al.

(10) Patent No.: US 9,660,624 B1
(45) Date of Patent: May 23, 2017

(54) METHODS AND APPARATUS FOR IMPLEMENTING FEEDBACK LOOPS

(71) Applicant: Altera Corporation, San Jose, CA (US)

(72) Inventors: Nima Safari, High Wycombe (GB); Volker Mauer, Princes Risborough (GB); Shahin Gheitanchi, Maidenhead (GB)

(73) Assignee: Altera Corporation, San Jose, CA (US)

( * ) Notice: Subject to any disclaimer, the term of this patent is extended or adjusted under 35 U.S.C. 154(b) by 457 days.

(21) Appl. No.: 14/221,819

(22) Filed: Mar. 21, 2014

(51) Int. Cl.
*G06F 17/10* (2006.01)
*H03K 5/14* (2014.01)

(52) U.S. Cl.
CPC .................................. H03K 5/14 (2013.01)

(58) Field of Classification Search
USPC ................................................ 708/300–323
See application file for complete search history.

(56) References Cited

U.S. PATENT DOCUMENTS

| | | | | |
|---|---|---|---|---|
| 4,751,663 A | * | 6/1988 | Yamazaki | H03H 17/04 708/300 |
| 4,972,356 A | * | 11/1990 | Williams | H03H 17/0416 708/313 |
| 5,089,981 A | * | 2/1992 | Cabot | H03H 17/04 708/319 |
| 5,381,356 A | * | 1/1995 | Takahashi | H03H 17/026 708/306 |
| 5,381,358 A | * | 1/1995 | Sakamoto | H03H 17/04 708/320 |
| 6,177,897 B1 | | 1/2001 | Williams, III | |
| 6,845,135 B2 | | 1/2005 | Du | |
| 7,292,630 B2 | | 11/2007 | Jiang | |
| 8,477,833 B2 | | 7/2013 | Bulzacchelli et al. | |
| 8,543,634 B1 | | 9/2013 | Xu et al. | |
| 8,543,795 B2 | | 9/2013 | Master et al. | |
| 8,862,649 B2 | * | 10/2014 | Kang | H04L 27/2624 708/319 |
| 2013/0170585 A1 | | 7/2013 | Rabinovitch et al. | |

* cited by examiner

*Primary Examiner* — Tan V. Mai
(74) *Attorney, Agent, or Firm* — Jason Tsai

(57) ABSTRACT

Circuitry that efficiently implements loop functions in an integrated circuit is provided. The circuitry combines a feed-forward circuit with a feedback loop that includes a unit delay element in a feedback path. The feedback path may couple the output of a processing element to the input of the processing element. The processing element may implement a function that satisfies commutative, associative, and distributive properties. Combining the feedback loop with the feed-forward circuit may allow for register retiming in the feedback loop and for register pipelining with optional register retiming in the feed-forward circuit. The circuitry may thus trade off an increase in throughput and clock frequency for additional resources.

22 Claims, 8 Drawing Sheets

METHODS AND APPARATUS FOR IMPLEMENTING FEEDBACK LOOPS

BACKGROUND

This invention relates to integrated circuits and, more particularly, to implementing loops in an integrated circuit.

Every transition from one technology node to the next technology node has resulted in smaller transistor geometries and thus potentially more functionality implemented per unit of integrated circuit area. Synchronous integrated circuits have further benefited from this development as evidenced by reduced interconnect and cell delays, which has led to performance increases. However, more recent technology nodes have seen a significant decline in the reduction of delays and thus a decline in the performance increase.

Solutions such as register pipelining have been proposed to further increase the performance. When implementing register pipelining, additional registers are inserted between synchronous elements, which lead to an increase in latency at the benefit of increased clock frequencies and throughput. However, performing register pipelining often involves spending significant time and effort because several iterations of locating performance bottlenecks, inserting or removing registers, and compiling the modified integrated circuit design are usually required.

Register pipelining is often also problematic for integrated circuits with feedback loop circuitry such as accumulation operations, infinite impulse response filters, phase-locked loop circuits, proportional-integral controllers, proportional-integral-derivative controllers, clock recovery modules, just to name a few.

SUMMARY

Embodiments relate to integrated circuits and, more particularly, to implementing circuits with loop functions such as infinite impulse response (IIR) filters in an integrated circuit.

Circuitry for implementing a loop function may include an input port, an output port, a feedback loop circuit, and a feed-forward circuit. The feedback loop circuit may have a first unit delay element (e.g., a first set of registers coupled in series) in a single feedback path, and the feed-forward circuit may have a second unit delay element (e.g., a second set of registers coupled in series). The feedback loop circuit may be coupled between the input port and the feed-forward circuit, while the feed-forward circuit may be coupled between the feedback loop circuit and the output port.

The feedback loop circuit may further include a third unit delay element (e.g., a third set of registers) in series with the first unit delay element in the single feedback path. If desired, the feedback loop circuit may further include a processing element (e.g., embedded microprocessors, digital signal processors (DSP), microcontrollers, arithmetic operators, or other processing circuitry) with an input and an output, and the output of the processing element may be coupled to the input of the processing element through the single feedback path.

It is appreciated that the present invention can be implemented in numerous ways, such as a process, an apparatus, a system, a device, instructions on a computer readable medium. Several inventive embodiments of the present invention are described below.

In certain embodiments, the feed-forward circuit may include a processing element with two inputs and an output. The two inputs of the processing element in the feed-forward circuit may be coupled to the feedback loop and the second unit delay element, while the output may be coupled to the output port. In other cases, the circuitry may include a pipeline element coupled to each of the two inputs of the processing element in the feed-forward circuit.

Further features of the invention, its nature and various advantages, will be more apparent from the accompanying drawings and the following detailed description of the preferred embodiments.

DETAILED DESCRIPTION

Embodiments relate to integrated circuits and, more particularly, the implementation of pipelined loops in an integrated circuit is described.

As mentioned above, register pipelining is often problematic for integrated circuits with feedback loop circuitry such as accumulation operations, infinite impulse response filters, phase-locked loop circuits, proportional-integral controllers, proportional-integral-derivative controllers, clock recovery modules, just to name a few.

It may be desirable to implement a loop circuit using a feedback loop with a feedback path coupled to a feed-forward circuit, which may enable register pipelining and thus lead to an increase in throughput and clock frequencies.

It will be obvious to one skilled in the art, that the present exemplary embodiments may be practiced without some or all of these specific details. In other instances, well-known operations have not been described in detail in order not to unnecessarily obscure the present embodiments.

Figure 1:
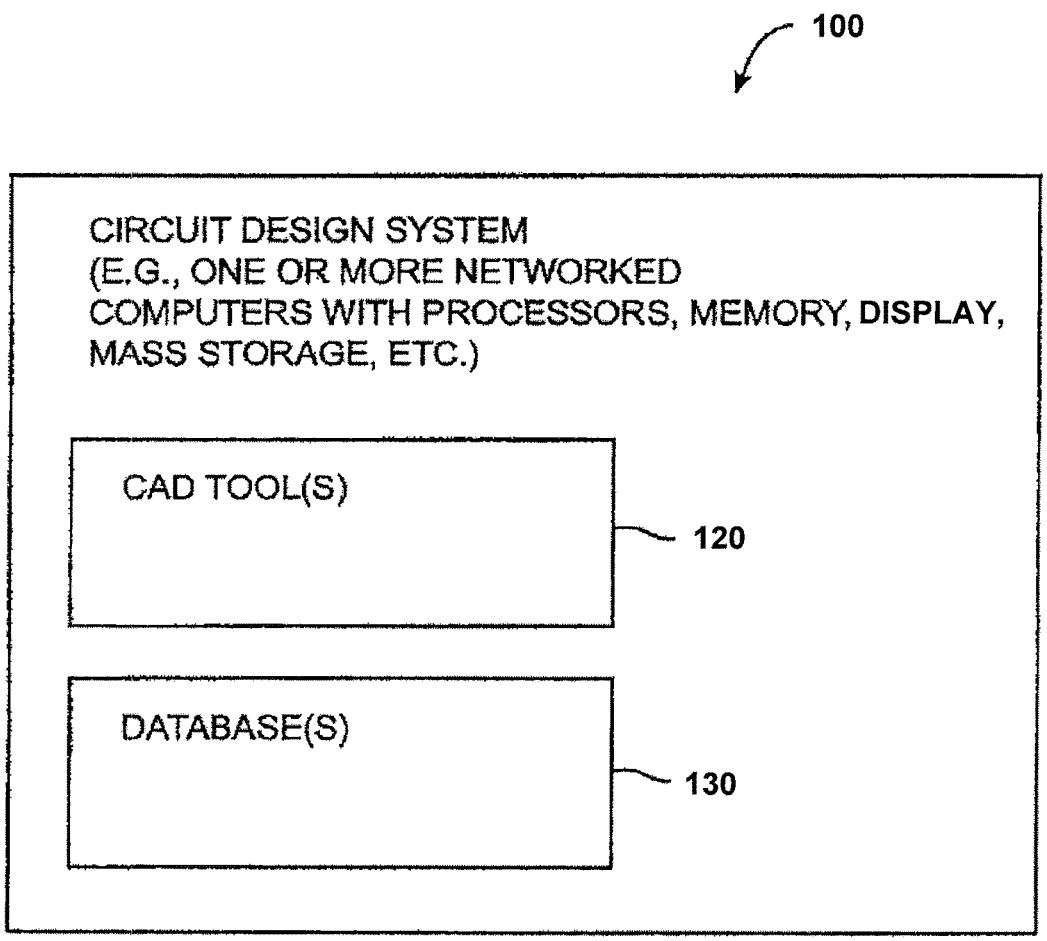
FIG. 1 is a diagram of an illustrative logic design system for generating configuration data for implementing custom circuit designs in accordance with an embodiment.

An illustrative logic design system 100 in accordance with the present invention is shown in FIG. 1. System 100 may be based on one or more processors such as personal computers, workstations, etc. The processor(s) may be linked using a network (e.g., a local or wide area network). Memory in these computers or external memory and storage devices such as internal and/or external hard disks and/or server storage such as server storage provided in data centers or in the "cloud" may be used to store instructions and data. A display may be used to visualize tasks executed by the processor(s) or information stored in memory.

Software-based components such as computer-aided design tools 120 and databases 130 reside on system 100. During operation, executable software such as the software of computer-aided design (CAD) tools 120 runs on the processor(s) of system 100. Databases 130 are used to store data for the operation of system 100. In general, software and data may be stored on any computer-readable medium (storage) in system 100. Such storage may include computer memory chips, removable and fixed media such as hard disk drives, flash memory, compact discs (CDs), digital versatile disks (DVDs), Blu-ray discs, other optical media, and floppy diskettes, tapes, or any other suitable memory or storage device(s). When the software of system 100 is installed, the storage of system 100 has instructions and data that cause the computing equipment in system 100 to execute various methods (processes). When performing these processes, the computing equipment is configured to implement the functions of the logic design system.

The computer-aided design (CAD) tools 120, some or all of which are sometimes referred to collectively as a CAD tool or tools may be provided by a single vendor or multiple vendors. CAD tools 120 may be provided as one or more suites of tools (e.g., a compiler suite for performing tasks associated with implementing a circuit design in a programmable logic device) and/or as one or more separate software components (tools). Database(s) 130 may include one or more databases that are accessed only by a particular tool or tools and may include one or more shared databases. Shared databases may be accessed by multiple tools. For example, a first tool may store data for a second tool in a shared database. The second tool may access the shared database to retrieve the data stored by the first tool. This allows one tool to pass information to another tool. CAD tools may also pass information between each other without storing information in a shared database if desired.

CAD tools 120 may receive a logic design description. CAD tools 120 may generate configuration data or a mask set or a combination thereof based on the logic design description for implementing the logic design in an integrated circuit (e.g., a programmable logic device).

Figure 2:
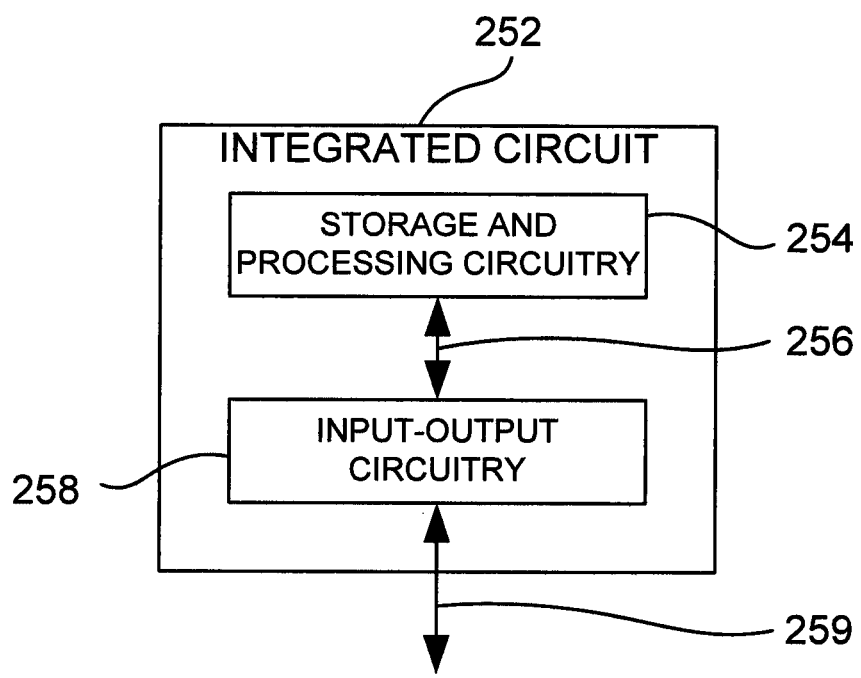
FIG. 2 is a diagram of an illustrative integrated circuit in accordance with an embodiment.

An illustrative embodiment of an integrated circuit 252 in accordance with the present invention is shown in FIG. 2. Integrated circuit 252 may include storage and processing circuitry 254 and input-output circuitry 258. Storage and processing circuitry 254 may include embedded microprocessors, digital signal processors (DSP), microcontrollers, or other processing circuitry. The storage and processing circuitry 254 may further have random-access memory (RAM), first-in first-out (FIFO) circuitry, stack or last-in first-out (LIFO) circuitry, read-only memory (ROM), or other memory elements.

Input/output circuitry may include parallel input/output circuitry, differential input/output circuitry, serial data transceiver circuitry, or other input/output circuitry suitable to transmit and receive data. Internal interconnection resources 256 such as conductive lines and busses may be used to send data from one component to another component or to broadcast data from one component to one or more other components. Internal interconnection resources 256 may also include network-on-chip (NoC) or other on chip interconnection resources. External interconnection resources 259 such as conductive lines and busses, optical interconnect infrastructure, or wired and wireless networks with optional intermediate switches may be used to communicate with other devices.

Figure 3:
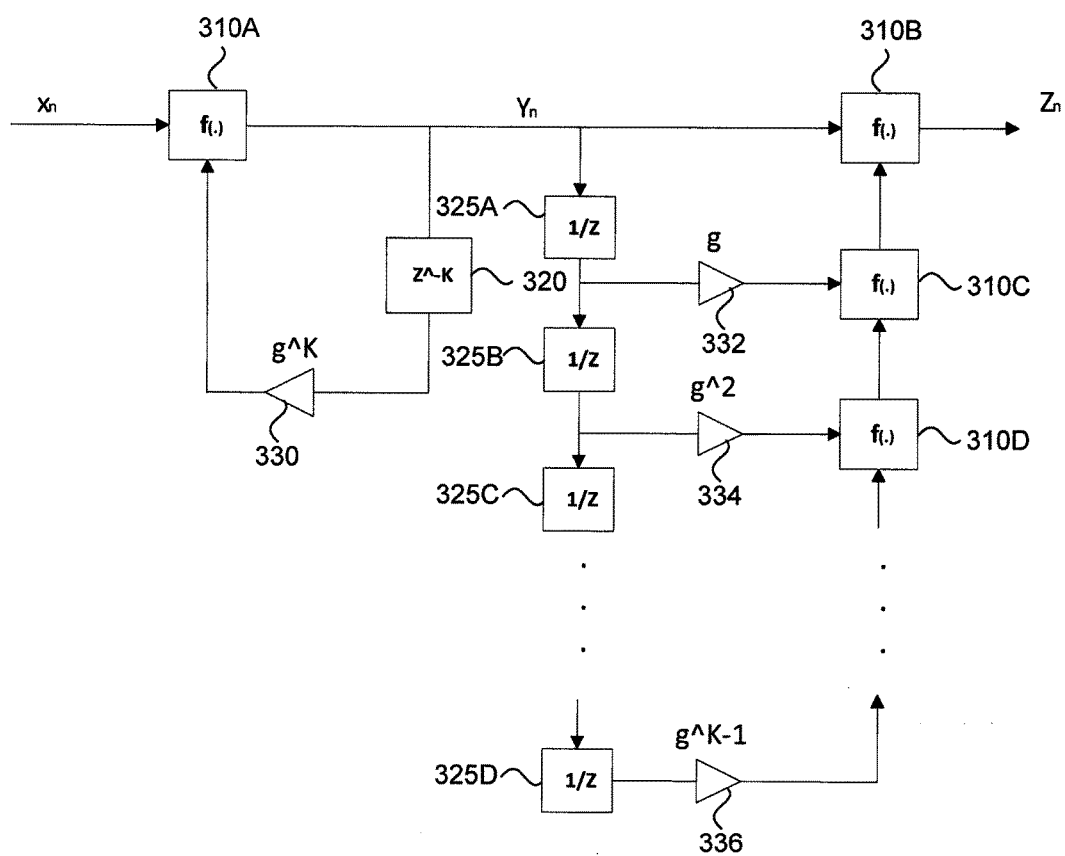
FIG. 3 is a diagram of an illustrative feedback loop with a single feedback path coupled to a feed-forward circuit in accordance with an embodiment.

Many logic designs that are implemented by an integrated circuit may include feedback loop circuitry. FIG. 3 shows a diagram of an illustrative implementation of feedback loop circuitry in accordance with an embodiment.

As shown, the implementation of the feedback loop circuitry may include a single feedback path with K-units delay element 320 and multiplier 330 between the output of processing element 310A and one of the inputs of processing element 310A. The output of processing element 310A may be coupled to a feed-forward circuit. The feed-forward circuit may include unit delay elements 325A, 325B, 325C, 325D, etc., multipliers 332, 334, 336, etc., and processing elements 310B, 310C, 310D, etc.

Processing elements 310A, 310B, 310C, 310D, etc. may implement any function that satisfies commutative (i.e., $f(a,b)=f(b,a)$), associative (i.e., $f(g(a,b),c)=f(a,g(b,c))$), and distributive (i.e., $f(h*a,b)=h*f(a,b/h)$) properties. For example, the processing elements 310A may implement arithmetic functions such as additions, multiplications, maximum or minimum functions, etc. If desired, the processing elements may implement logical functions such as logic AND, logic OR, logic NAND, logic NOR, etc.

A unit delay element may be any circuit element which allows a signal to be delayed by a number of samples. As an example, a unit delay element may be implemented by a storage element or a pipelining element which may delay a signal by one sample, whereby one sample may be in multiples or fractions of clock periods. Thus, the unit delay element may be a pipelining element such as a buffer, a register, a latch, a shift register, or a first-in first-out (FIFO), just to name a few.

As shown, the loop circuitry implements the equivalent of a single-cycle feedback circuit with an input and an output port that has a processing element coupled between the input and output ports and a feedback path between the output and an input of the processing element, whereby the feedback path include a single unit delay denoted by $1/Z$ or $Z^{-1}$ and a multiplier. The processing element may implement a function $f(.)$ which satisfies commutative, associative, and distributive properties and the multiplier a multiplication with a factor g. Thus, the single-cycle feedback circuit may be modeled by:

$$Z_n = f(g*Z_{n-1}, X_n) \quad (1)$$

Accordingly, the feedback path of FIG. 3 may be modeled by:

$$Y_n = f(g^K*Y_{n-K}, X_n) \quad (2)$$

Similarly, the feed-forward circuit may be modeled by:

$$Z_n = f(Y_n, f(g*Y_{n-1}, f(g^2*Y_{n-2}, \ldots f(g^{(K-2)}*Y_{n-K+2}, g^{(K-1)}*Y_{n-K+1})\ldots))) \quad (3)$$

Substituting $Y_n$ in equation (3) by $Y_n$ from equation (2) yields:

$$Z_n = f(f(g^K*Y_{n-K}, X_n), f(g*Y_{n-1}, f(g^2*Y_{n-2}, \ldots f(g^{(K-2)}*Y_{n-K+2}, g^{(K-1)}*Y_{n-K+1})\ldots))) \quad (4)$$

Using the commutative and associative properties above, equation (4) can be represented as:

$$Z_n = f(X_n, f(g^K*Y_{n-K}, f(g*Y_{n-1}, f(g^2*Y_{n-2}, \ldots f(g^{(K-2)}*Y_{n-K+2}, g^{(K-1)}*Y_{n-K+1})\ldots))) \quad (5)$$

Using the associative and distributive properties above, equation (5) can be represented as:

$$Zn = f(Xn, g*f(Yn-1, f(g*Yn-2, f(g^2*Yn-3, \ldots f(g^(K-2)*Yn-K+1, g^(K-1)*Yn-K)\ldots)))) = f(Xn, g*Zn-1) \quad (6)$$

Thus, equations (1) and (6) are equal, which demonstrates that the loop circuitry shown in FIG. 3 implements the equivalent of a single-cycle feedback circuit described above.

Figure 4A:
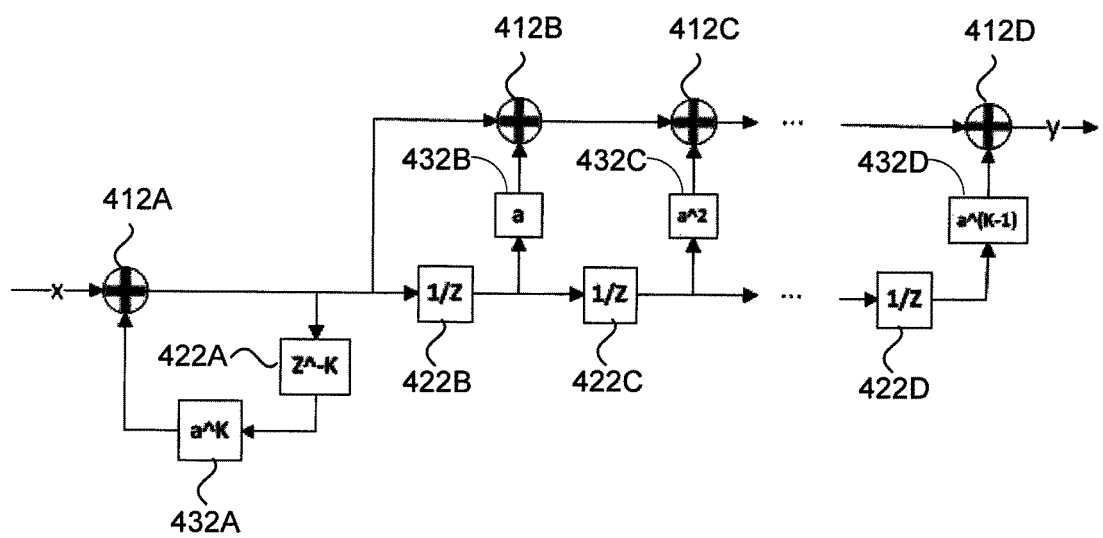
FIG. 4A is a diagram of an illustrative infinite impulse response filter with a feedback loop coupled to a feed-forward circuit in accordance with an embodiment.

An infinite impulse response (IIR) filter is an example of a circuit with a feedback loop. An embodiment of an IIR filter with a single-cycle feedback loop is shown in FIG. 4A. As shown, the IIR filter may include a single feedback path with K-units delay element 422A and multiplier 432A between the output of processing element 312A to one of the inputs of processing element 412A. The output of processing element 412A may be coupled to a feed-forward circuit. The feed-forward circuit may include unit delay elements 422B, 422C, 422D, etc., multipliers 432B, 432C, 432D, etc., and processing elements 412B, 412C, 412D, etc.

The K-units delay element 422A and the unit delay elements 422B, 422C, 422D, etc. may be pipelining elements such as buffers, registers, latches, shift registers, or FIFOs, just to name a few. Multipliers 432A, 432B, 432C, 432D, etc. receive signals from the outputs of the K-units delay element 422A, and unit delay elements 422B, 422C, 422D, etc., respectively and multiply the signals by $a^K$, $a$, $a^2$, $a^{(K-1)}$, etc., respectively.

Processing elements 412A, 412B, 412C, 412D, etc. may receive the respective products and implement addition operations to produce the sum of all previously computed products. Thus, the transfer function of the IIR filter of FIG. 4A is:

$$(a*Z^{-1} + a^2*Z^{-2} + \ldots + a^{(K-1)}*Z^{-(K-1)})/(1 - a^K Z^{-K}) = 1/(1 - a*Z^{-1}) \quad (7)$$

The throughput and clock frequency at which the IIR filter of FIG. 4A may be operated may be increased through retiming and register pipelining. An embodiment of a retimed and register pipelined IIR filter in which registers are used as unit delay elements is shown in FIG. 4B.

Figure 4B:
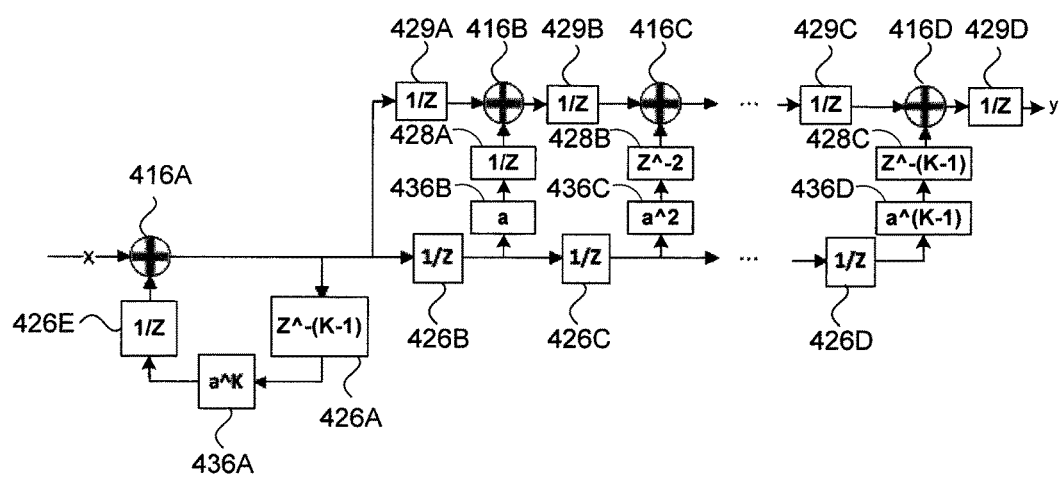
FIG. 4B is a diagram of an illustrative infinite impulse response filter with a feedback loop coupled to a register pipelined feed-forward circuit in accordance with an embodiment.

The retimed and register pipelined IIR filter of FIG. 4B may include a feed-forward circuit and a feedback loop from an output to an input of adder circuit 416A with (K-1) registers 426A, a multiplier 436A, and register 426E in the feedback path. As shown, the feed-forward circuit may include adder circuits 416B, 416C, 416D, etc., multipliers 436B, 436C, 436D, etc., registers 426B, 426C, 426D, etc., and pipeline registers in the multiplier path such as (K-1) registers 428C, ..., two registers 428B, and single registers 428A and pipeline registers in the adder path such as registers 429A, 429B, 429C, etc. If desired, additional pipeline registers may be placed at the output of the IIR filter such as register 429D.

As shown in FIG. 4B, the feedback loop of the retimed and register pipelined IIR filter has been retimed compared to the feedback loop of the IIR filter in FIG. 4A by moving one of the K registers 422A from the input of multiplier 432A to the output of the multiplier. This is shown in FIG. 4B by register 426E being placed between multiplier 436A and adder circuit 416A. The feedback path of FIG. 4B may be further retimed based on the number of available registers for retiming (i.e., the number K). For example, registers from the (K-1) registers 426A may be removed from their current position and placed between a first and second portion of adder circuit 416A, between multiplier 436A and adder circuit 416A, between stages of the multiplier 436, or any combination thereof.

The feed-forward circuit of the retimed and register pipelined IIR filter in FIG. 4B has been pipelined compared to the feed-forward circuit of the IIR filter in FIG. 4A. The register pipelining of the IIR filter in FIG. 4A may be performed by inserting registers and retiming the inserted registers. For example, consider the scenario in which K registers have been inserted at the output of adder circuit 416D in FIG. 4B. Register retiming may move (K-1) registers of the K registers to the inputs of adder circuit 416D, leaving one register (e.g., register 429D) at the output of adder circuit 416D.

The (K-1) registers at one of the inputs of adder circuit 416D (e.g., (K-1) registers 428C) may remain grouped together. If desired, register retiming may further move the (K-1) registers away from each of the inputs of adder circuit 416D. For example, register retiming may place a subset of (K-1) registers 428C inside multiplier 436D or adder circuit 416D. As shown, register retiming has further moved the (K-2) registers of the (K-1) registers at the other input of adder circuit 416D, leaving just one register (e.g., register 429C) in place.

Register retiming may recursively move registers through adder circuits until there is one register between each adder circuit in the feed-forward circuit. Thus, the inputs of adder circuit 416B may have registers 428A and 429A, the inputs of adder circuit 416C registers 428B and 429B, etc.

The retimed and register pipelined IIR filter is merely illustrative and not intended to limit the scope of the invention. If desired, additional pipeline registers may be inserted, some or all of the inserted pipeline registers may be removed, retiming of the pipeline registers and the registers in the feedback loop may place registers at different positions such as within the adder circuits, within the multipliers, or in any combination thereof.

Retiming may move registers in the feedback loop independent of register pipelining in the feed-forward circuit, and register pipelining may insert registers in the feed-forward circuit independent of retiming in the feedback loop.

Figure 4C:
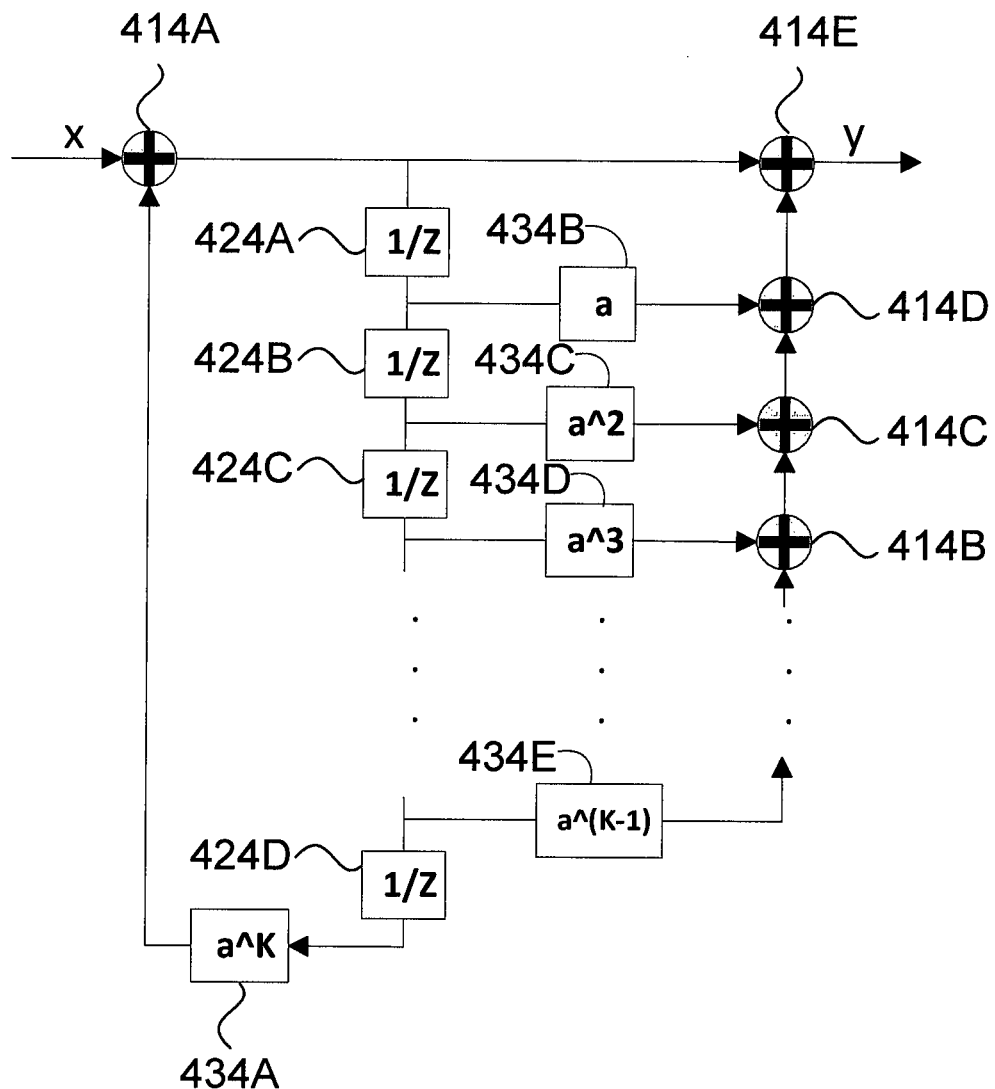
FIG. 4C is a diagram of an illustrative infinite impulse response filter with a feedback loop and a feed-forward circuit that share register resources in accordance with an embodiment.

An alternative embodiment of an IIR filter with resource sharing between the feed-forward circuit and the feedback loop is shown in FIG. 4C. As shown, the IIR filter may share (K-1) registers 424A, 424B, 424C, etc. from the feed-forward circuit with the feedback loop between the output and an input of adder circuit 414A. Thus, the IIR filter may use K registers 424A-424D, K multipliers 434A-434E, and K adder circuits 414A-414D.

If desired, the feedback loop of the IIR filter shown in FIG. 4C may be retimed and the feed-forward circuit may be register pipelined. For example, retiming may place register 424D between multiplier 434A and adder circuit 414A, within multiplier 434A, or within adder circuit 414A. As another example, register pipelining may insert registers at the output of adder circuit 414E and recursively retime the registers backwards towards the inputs of adder circuits 414E, 414D, 414C, 414B, etc. and/or towards the inputs of multipliers 434B, 434C, 434D, 434E, etc.

FIGS. 4A, 4B, and 4C show different embodiments of a first order IIR filter. If desired, an alternative embodiment of an IIR filter may be implemented. The alternative embodiment may use any combination of the three embodiments shown in FIGS. 4A, 4B, and 4C. For example, the alternative embodiment may share a first subset of the registers in the feed-forward circuit with the feedback loop, while a second subset is exclusively used in the feedback loop and a third subset is exclusively used in the feed-forward circuit. If desired, the alternative embodiment may have an arbitrary number of pipeline registers in the feed-forward circuit, the retiming may place registers anywhere in the feedback path, etc.

The representation of the IIR filter in FIGS. 4A, 4B, and 4C as a first order IIR filter has been selected in order not to unnecessarily obscure the present embodiments and is not intended to limit the scope of the invention. In fact, any IIR filter of order n can be reconstructed using cascade/parallel realization of first order IIR filters.

Another example of a circuit with a feedback loop is a peak searching circuit which may be used in crest factor reduction circuitry. A peak searching circuit may compare a current sample with a prior sample and select the bigger of the two samples. As an example, consider an implementation of a peak searching circuit, which includes a comparator, a multiplexer, and a unit delay element. The comparator and the multiplexer may receive the current sample from an input port and a prior sample from the unit delay element. The comparator may select one of the two samples on the input of the multiplexer (e.g., the bigger of the two samples) and provide the selected sample to the output port and to the unit delay element in a feedback loop.

Figure 5:
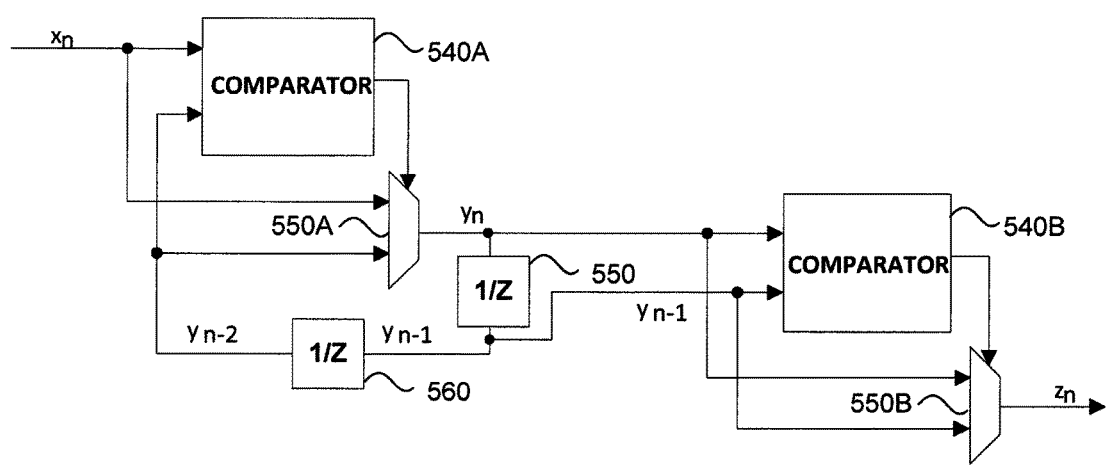
FIG. 5 is a diagram of an illustrative peak searching circuit used in crest factor reduction circuitry with a feedback loop coupled to a feed-forward path in accordance with an embodiment.

FIG. 5 shows an embodiment of a peak searching circuit with a feedback loop coupled to a feed-forward circuit. As shown in FIG. 5, the peak searching circuit includes comparators 540A and 540B, multiplexers 550A and 550B, and unit delay elements 550 and 560. As shown, unit delay element 550 is shared between the feed-forward circuit and the feedback loop.

Retiming and register pipelining may further increase the throughput and clock frequency of the peak searching circuit. For example, retiming may place unit delay element 560 at the input of multiplexer 550A and comparator 540A or even behind a portion of comparator 540A. Register pipelining may insert registers at the output of multiplexer 550B and retime the feed-forward circuit by moving the registers to the three inputs of multiplexer 550B and from there to the inputs of comparator 540B.

Figure 6:
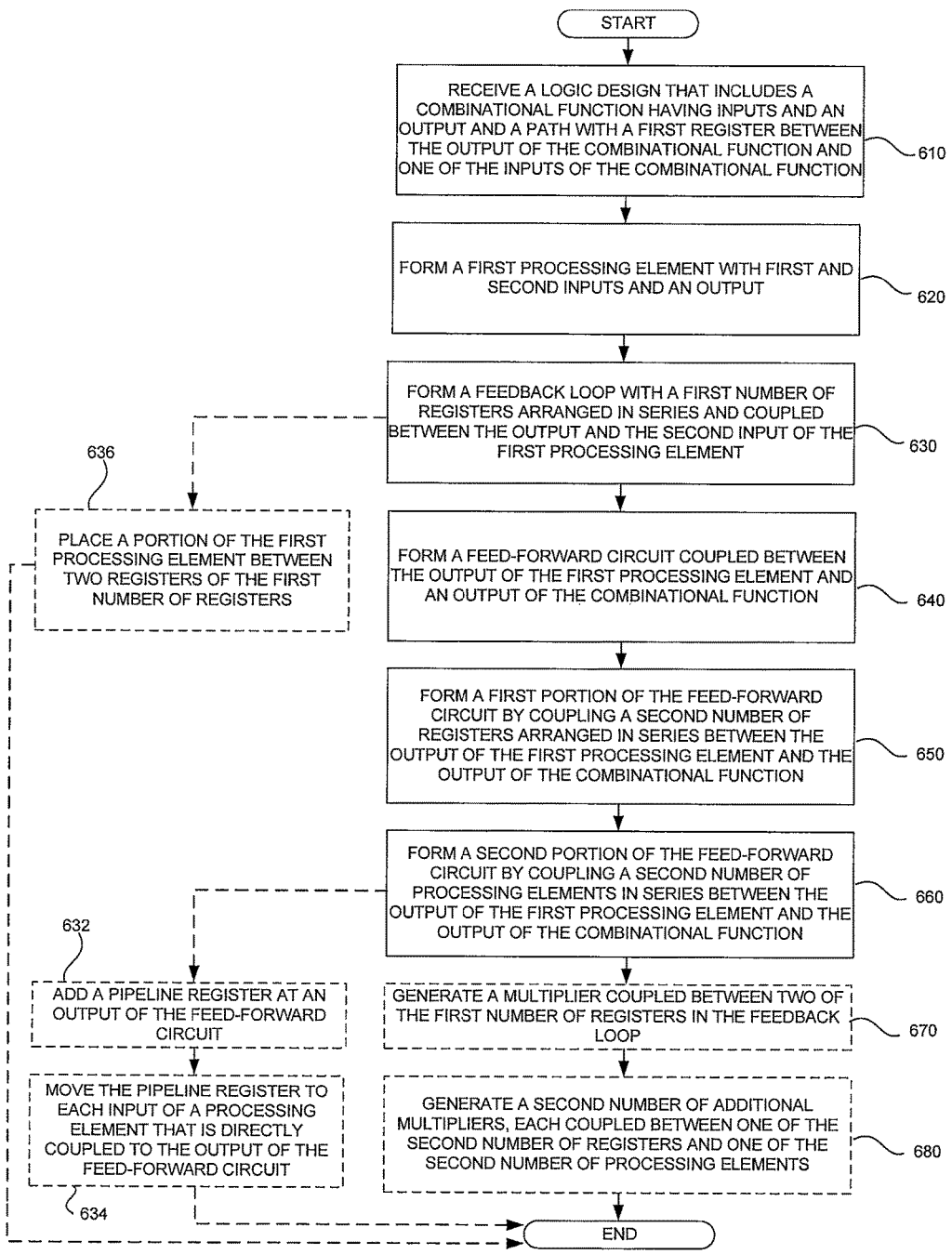
FIG. 6 is a flow chart of illustrative steps for implementing a logic design with a feedback loop in an integrated circuit in accordance with an embodiment.

FIG. 6 is a flow chart of illustrative steps that a CAD tool may perform during the implementation of a logic design with a feedback loop in an integrated circuit. During step 610, the CAD tool may receive the logic design. The logic design may include a combinational function that has inputs and an output. The logic design may further have a path with a first register between the output of the combinational function and one of the inputs of the combinational function.

During step 620, the CAD tool may form a first processing element with first and second inputs and an output. During step 630, the CAD tool may form a feedback loop with a first number of registers arranged in series. The feedback loop may couple the output of the first processing element to the second input of the first processing element. If desired, the CAD tool may place a portion of the first processing element between two registers of the first number of registers during step 636.

During step 640, the CAD tool may form a feed-forward circuit and couple the feed-forward circuit between the output of the first processing element and an output of the combinational function. During step 650, the CAD tool may form a first portion of the feed-forward circuit by coupling a second number of registers arranged in series between the output of the first processing element and the output of the combinational function.

During step 660, the CAD tool may form a second portion of the feed-forward circuit by coupling a second number of processing elements in series between the output of the first processing element and the output of the combinational function. If desired, the CAD tool may add a pipeline register at an output of the feed-forward circuit during step 632 and move the pipeline register to each input of a processing element that is directly coupled to the output of the feed-forward circuit during step 634.

During step 670, the CAD tool may generate a multiplier coupled between two of the first number of registers in the feedback loop and, during step 680, generate a second number of additional multipliers, each coupled between one of the second number of registers and one of the second number of processing elements.

If desired, the CAD tool may perform timing analysis of the generated circuitry and return to step 630 to further pipeline the feedback loop if timing analysis reveals that predefined timing requirements are not met.

The method and apparatus described herein may be incorporated into any suitable integrated circuit or system of integrated circuits. For example, the method and apparatus may be incorporated into numerous types of devices such as microprocessors or other ICs. Exemplary ICs include programmable array logic (PAL), programmable logic arrays (PLAs), field programmable logic arrays (FPGAs), electrically programmable integrated circuits (EPLDs), electrically erasable programmable integrated circuits (EEPLDs), logic cell arrays (LCAs), field programmable gate arrays (FPGAs), application specific standard products (ASSPs), application specific integrated circuits (ASICs), just to name a few.

The integrated circuit described herein may be part of a data processing system that includes one or more of the following components; a processor; memory; I/O circuitry; and peripheral devices. The data processing system can be used in a wide variety of applications, such as computer networking, data networking, instrumentation, video processing, digital signal processing, or any suitable other application where using circuitry with a feedback loop is desirable.

Although the method operations were described in a specific order, it should be understood that other operations may be performed in between described operations, described operations may be adjusted so that they occur at slightly different times or described operations may be distributed in a system which allows the occurrence of the processing operations at various intervals associated with the processing, as long as the processing of the overlay operations are performed in a desired way.

The foregoing is merely illustrative of the principles of this invention and various modifications can be made by those skilled in the art without departing from the scope and spirit of the invention. The foregoing embodiments may be implemented individually or in any combination.

What is claimed is:

1. Circuitry for implementing a loop function, comprising:
   an input port;
   an output port;
   a feedback loop circuit having a first number of unit delay elements and a processing element in a feedback path, wherein the first number of unit delay elements delay a signal in the feedback path by at most a first delay time; and
   a feed-forward circuit having a second number of unit delay elements, wherein the second number of unit delay elements delay a signal in the feed-forward circuit by at most a second delay time that is less than the first delay time, wherein the feedback loop circuit is coupled between the input port and the feed-forward circuit, and wherein the feed-forward circuit is coupled between the feedback loop circuit and the output port.

2. The circuitry of claim 1, wherein at least a portion of the feedback loop circuit is implemented on a programmable integrated circuit.

3. The circuitry of claim 1, wherein each unit delay element in the second number of unit delay elements comprises a pipelining element.

4. The circuitry of claim 3, wherein the pipelining element comprises a register.

5. The circuitry of claim 1, wherein the first number of unit delay elements in the feedback path are coupled in series.

6. The circuitry of claim 5, wherein the feedback loop circuit further comprising:
a processing element with an input and an output, wherein the output of the processing element is coupled to the input of the processing element through the feedback path.

7. The circuitry of claim 6, wherein the processing element includes an arithmetic operator circuit.

8. The circuitry of claim 6, wherein the feedback loop circuit further comprises:
a multiplier circuit coupled between a first unit delay element and a second unit delay element in the feedback path.

9. The circuitry of claim 1, wherein the feed-forward circuit further comprises:
a processing element having first and second inputs and an output, wherein the first input is coupled to the feedback loop circuit, the second input is coupled to the second number of unit delay elements, and the output is coupled to the output port.

10. The circuitry of claim 9, further comprising:
a pipeline element coupled to each of the two inputs of the processing element.

11. The circuitry of claim 9, wherein the feed-forward circuit further comprises:
a multiplier circuit coupled between a unit delay element in the second number of unit delay elements and the processing element.

12. The circuitry of claim 11, wherein the circuitry implements an infinite impulse response filter.

13. A method for implementing an integrated circuit that includes a feed-forward circuit coupled to a feedback path, comprising:
forming a first set of pipeline elements in the feedback path that provide a first maximum number of unit delays, wherein the feedback path couples an output of a first processing element to an input of the first processing element; and
forming a second set of pipeline elements and a second processing element in the feed-forward circuit, wherein the second set of pipeline elements provide a second maximum number of unit delays that is less than the first maximum number of unit delays, and wherein the feed-forward circuit is coupled to the feedback path.

14. The method of claim 13, further comprising:
placing a portion of the first processing element between a first pipeline element in the first set of pipeline elements and a second pipeline element in the first set of pipeline elements.

15. The method of claim 13, further comprising:
forming a first register that is coupled between the output of the first processing element and the second processing element; and
forming a second register that is coupled between an additional pipeline element in the second set of pipeline elements and the second processing element.

16. The method of claim 13, further comprising:
forming a first multiplier that is coupled between the first and second pipeline elements; and
forming a second multiplier that is coupled between the third pipeline element and the second processing element.

17. A non-transitory computer-readable storage medium for implementing a logic design on an integrated circuit, wherein the logic design includes a feedback loop and a feed-forward circuit, and wherein the non-transitory computer-readable storage medium comprises instructions for:
implementing a first processing element having first and second inputs and an output;
generating the feedback loop, wherein the feedback loop is coupled between the output of the first processing element and the second input of the first processing element, and wherein the feedback loop includes a first number of registers coupled in series; and
generating the feed-forward circuit, wherein the feedforward circuit is coupled to the output of the first processing element, and wherein the feed-forward circuit includes one fewer register than the first number of registers that are coupled in series.

18. The non-transitory computer-readable storage medium defined in claim 17, further comprising instructions for:
placing a portion of the first processing element between two registers in the first number of registers.

19. The non-transitory computer-readable storage medium defined in claim 17, further comprising instructions for:
generating a second number of registers and a second number of processing elements in the feed-forward circuit, wherein second number of registers is one less than the first number of registers.

20. The non-transitory computer-readable storage medium defined in claim 19, further comprising instructions for:
inserting a pipeline register at each input of a predetermined processing element of the second number of processing elements, wherein the predetermined processing element is directly coupled to an output of the feed-forward circuit.

21. The non-transitory computer-readable storage medium defined in claim 19, further comprising instructions for:
generating a first portion of the feed-forward circuit coupled between the output of the first processing element and the output of the feed-forward circuit, wherein the first portion of the feed-forward circuit includes the second number of registers arranged in series.

22. The non-transitory computer-readable storage medium defined in claim 21, further comprising instructions for:
generating a second portion of the feed-forward circuit coupled between the output of the first processing element and the output of the feed-forward circuit, wherein the second portion of the feed-forward circuit includes the second number of processing elements arranged in series.

* * * * *